United States Patent
Sze et al.

(10) Patent No.: US 8,735,937 B2
(45) Date of Patent: May 27, 2014

(54) FULLY ISOLATED LIGBT AND METHODS FOR FORMING THE SAME

(75) Inventors: Jhy-Jyi Sze, Hsin-Chu (TW);
Biay-Cheng Hseih, Irvine, CA (US);
Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/601,229

(22) Filed: Aug. 31, 2012

(65) Prior Publication Data

US 2013/0320397 A1    Dec. 5, 2013

Related U.S. Application Data

(60) Provisional application No. 61/653,839, filed on May 31, 2012.

(51) Int. Cl.
*H01L 29/66*    (2006.01)
*H01L 21/70*    (2006.01)

(52) U.S. Cl.
USPC ............ 257/141; 257/140; 257/335; 257/368

(58) Field of Classification Search
CPC ........................................ H01L 29/66
USPC ............... 257/141, 140, 368, 423, 557, 565, 257/E29.197
See application file for complete search history.

(56) References Cited

U.S. PATENT DOCUMENTS

| | | | | |
|---|---|---|---|---|
| 5,731,603 A | * | 3/1998 | Nakagawa et al. | 257/141 |
| 5,920,087 A | * | 7/1999 | Nakagawa et al. | 257/140 |
| 6,064,086 A | * | 5/2000 | Nakagawa et al. | 257/335 |
| 6,191,453 B1 | | 2/2001 | Petruzzello et al. | |
| 6,191,456 B1 | * | 2/2001 | Stoisiek et al. | 257/368 |
| 2004/0251498 A1 | * | 12/2004 | Zingg et al. | 257/343 |
| 2008/0191316 A1 | * | 8/2008 | Lee | 257/592 |
| 2012/0161201 A1 | * | 6/2012 | Hsieh | 257/140 |
| 2012/0211869 A1 | * | 8/2012 | Lee et al. | 257/547 |

* cited by examiner

*Primary Examiner* — Long K Tran
*Assistant Examiner* — Dzung Tran
(74) *Attorney, Agent, or Firm* — Slater & Matsil, L.L.P.

(57) ABSTRACT

A device includes a dielectric layer, and a heavily doped semiconductor layer over the dielectric layer. The heavily doped semiconductor layer is of a first conductivity type. A semiconductor region is over the heavily doped semiconductor layer, wherein the semiconductor region is of a second conductivity type opposite the first conductivity type. A Lateral Insulated Gate Bipolar Transistor (LIGBT) is disposed at a surface of the semiconductor region.

20 Claims, 10 Drawing Sheets

FULLY ISOLATED LIGBT AND METHODS FOR FORMING THE SAME

This application claims the benefit of the following provisionally filed U.S. Patent application: Application Ser. No. 61/653,839, filed May 31, 2012, and entitled "Fully Isolated LIGBT;" which application is hereby incorporated herein by reference.

BACKGROUND

Insulated Gate Bipolar Transistor (IGBT) is an integrated combination of a bipolar transistor and a Metal-Oxide-Semiconductor Field-Effect Transistor (MOSFET). The IGBTs have superior on-state characteristics and excellent safe-operating window. The IGBTs in integrated circuits are commonly configured as Lateral Insulated Gate Bipolar Transistors (LIGBTs) and fabricated using a planar process sequence to minimize the cost and the complexity of the integrated circuit manufacturing processes.

A conventional LIGBT includes an n-type region, in which a p-body is formed. A gate is formed over the n-type region. A p+ cathode (which is also a source) is formed in the p-body. A p+ anode (which is also a drain) is formed in the n-type region and on the opposite side of the gate than the p+ cathode. A deep p-well region is formed under the n-type region, and a p-type substrate is under the deep p-well region. The deep p-well region acts as the isolation of the LIGBT. This LIGBT, however, suffers from hole overflow. Since the deep p-well region is formed by implanting p-type impurities deeply into the substrate, the impurity concentration of the deep p-well region is not high enough, and hence the isolation effect is not satisfactory. As a result, the holes in the n-type region overflow across the deep p-well region, and into the p-type substrate. The overflowed holes results in substrate noise and latch-up.

Other LIGBTs may be formed on a silicon-on-insulator substrate to avoid the hole overflow. The n-type region of the respective LIGBT is accordingly in contact with an underlying Buried Oxide (BOX) layer. In these LIGBTs, however, the holes in the n-type region are recombined at the interface between the n-type region and the BOX, causing current gain degradation, the lowering of the device driving capability, and the increase in the leakage current.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Lateral Insulated Gate Bipolar Transistors (LIGBTs) and the methods of forming the same are provided in accordance with various exemplary embodiments. The intermediate stages of forming the LIGBTs are illustrated. The variations of the embodiments are discussed. Throughout the various views and illustrative embodiments, like reference numbers are used to designate like elements.

Figure 1:
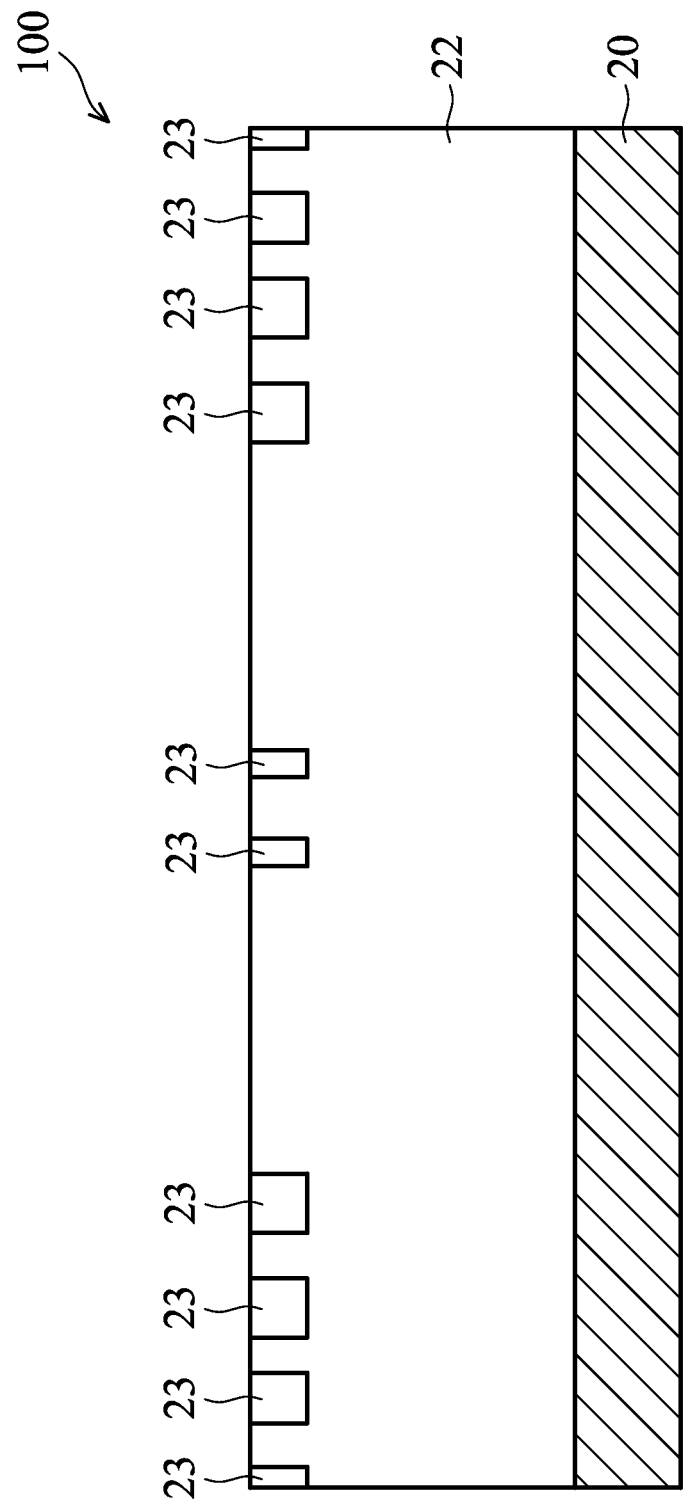
FIGS. 1 through 9 are cross-sectional views and a top view of intermediate stages in the manufacturing of a Lateral Insulated Gate Bipolar Transistors (LIGBTs) in accordance with some exemplary embodiments.

FIGS. 1 through 9 illustrate cross-sectional views and a top view in the manufacturing of a LIGBT in accordance with exemplary embodiments. Referring to FIG. 1, wafer 100, which includes semiconductor substrate 20, is provided. Semiconductor substrate 20 may comprise crystalline silicon, although other semiconductor materials such as silicon germanium, silicon carbon, or the like, may be used. In some embodiments, substrate 20 is heavily doped with a p-type impurity, and has an impurity concentration higher than about $1\times10^{19}/cm^3$. In the described embodiments, the term "heavily doped" means an impurity concentration above about $10^{19}/cm^3$, and is represented using a "+" sign following letter "p" or letter "n." One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments. Substrate 20 is alternatively referred to as a p+ substrate. In alternative embodiments, substrate 20 may be a p− substrate, an n+ substrate, or an n− substrate.

Epitaxy layer 22 is formed over substrate 20, and may be in-situ doped, for example, to an n-type impurity concentration between about $1\times10^{13}/cm^3$ and about $1\times10^{16}/cm^3$, for example, although different impurity concentrations may be used. The in-situ doping may be performed simultaneously with the proceeding of the epitaxy. In alternative embodiments, epitaxy layer 22 is doped through implantation.

Insulation regions 23 are also formed to extend from the top surface of epitaxy layer 22 into epitaxy layer 22. Insulation regions 23 may be Shallow Trench Isolation (STI) regions, and hence are referred to as STI regions 23 hereinafter, although they may also be other types of insulation regions such as field oxide regions. The field oxide regions may comprise a thermal oxide of silicon, which may be formed through local oxidation of epitaxy layer 22.

Figure 2:
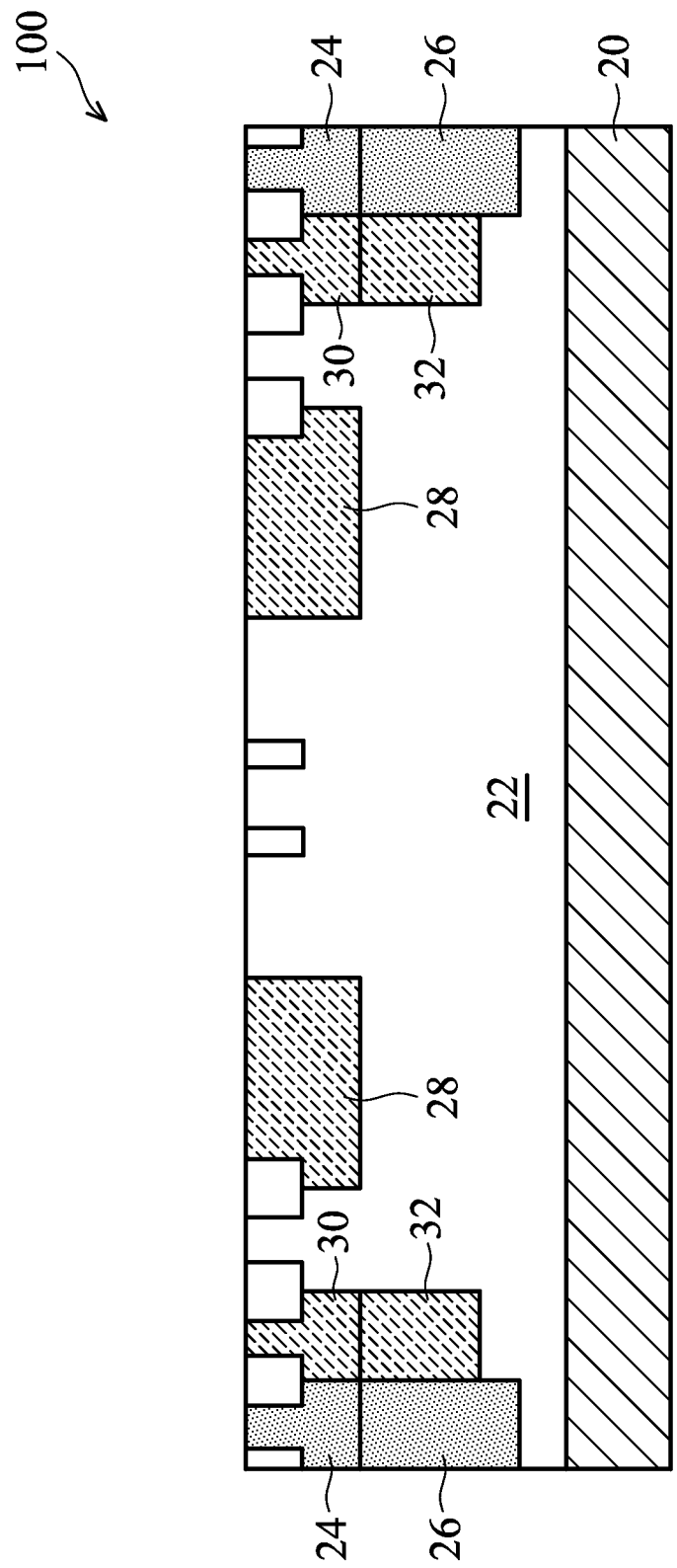

Referring to FIG. 2, n-well regions 24 and deep n-well regions 26 are formed in epitaxy layer 22, and extend from the top surface of epitaxy layer 22 down into epitaxy layer 22. N-well regions 24 and deep n-well regions 26 may be formed, for example, by implanting an n-type impurity into epitaxy layer 22. P-bodies 28 are also formed in epitaxy layer 22 through implantation. P-bodies 28 may have a p-type impurity concentration between about $10^{15}/cm^3$ and about $10^{17}/cm^3$, although a higher or a lower-type impurity concentration may be used. P-well regions 30 and deep p-well regions 32 are also formed in epitaxy layer 22, and extend from the top surface of epitaxy layer 22 down into epitaxy layer 22. P-well regions 30 and deep p-well regions 32 may be formed, for example, by implanting a p-type impurity into substrate 20. Deep n-well regions 26 may have a bottom surface deeper than the bottom surface of deep p-well regions 32. Alternatively, deep n-well regions 26 may have a bottom surface substantially level with the bottom surface of deep p-well regions 32.

Figure 3A:
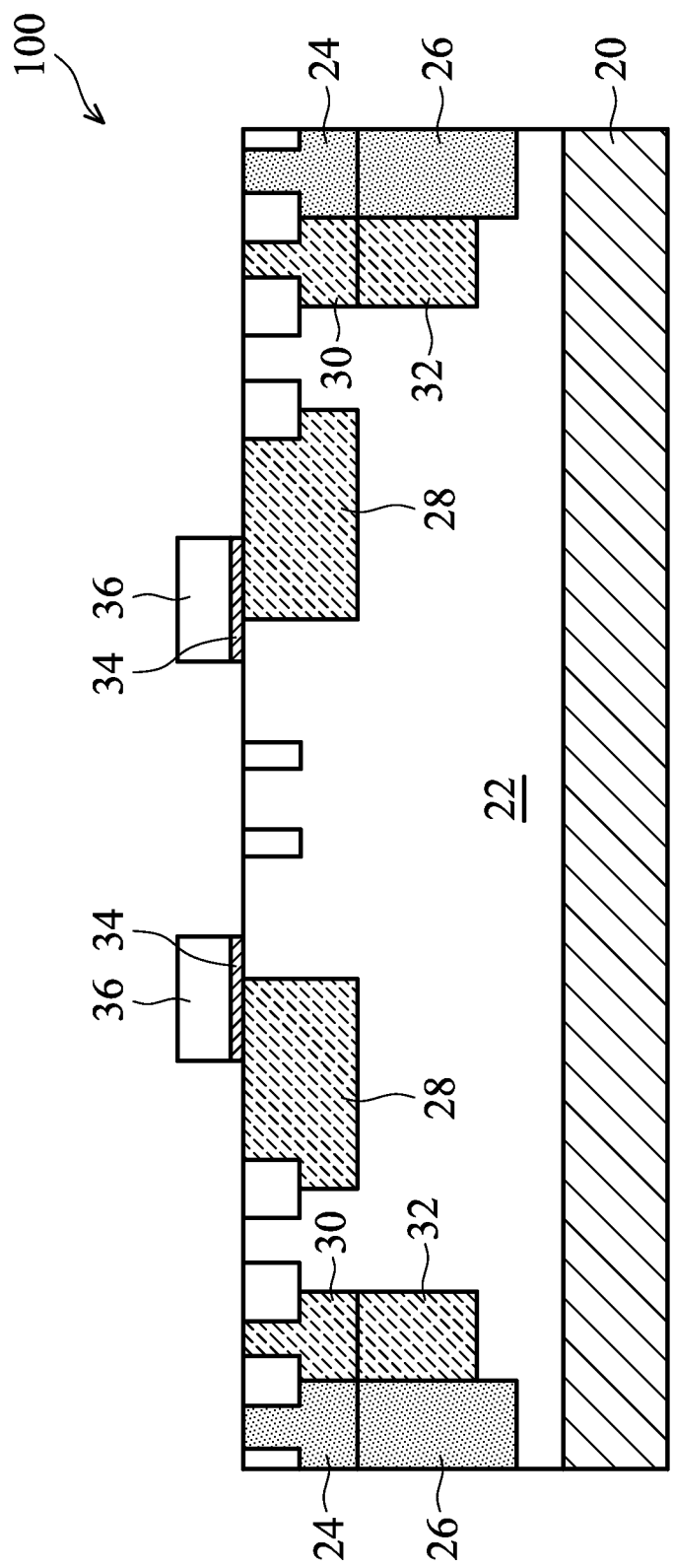
Figure 3B:
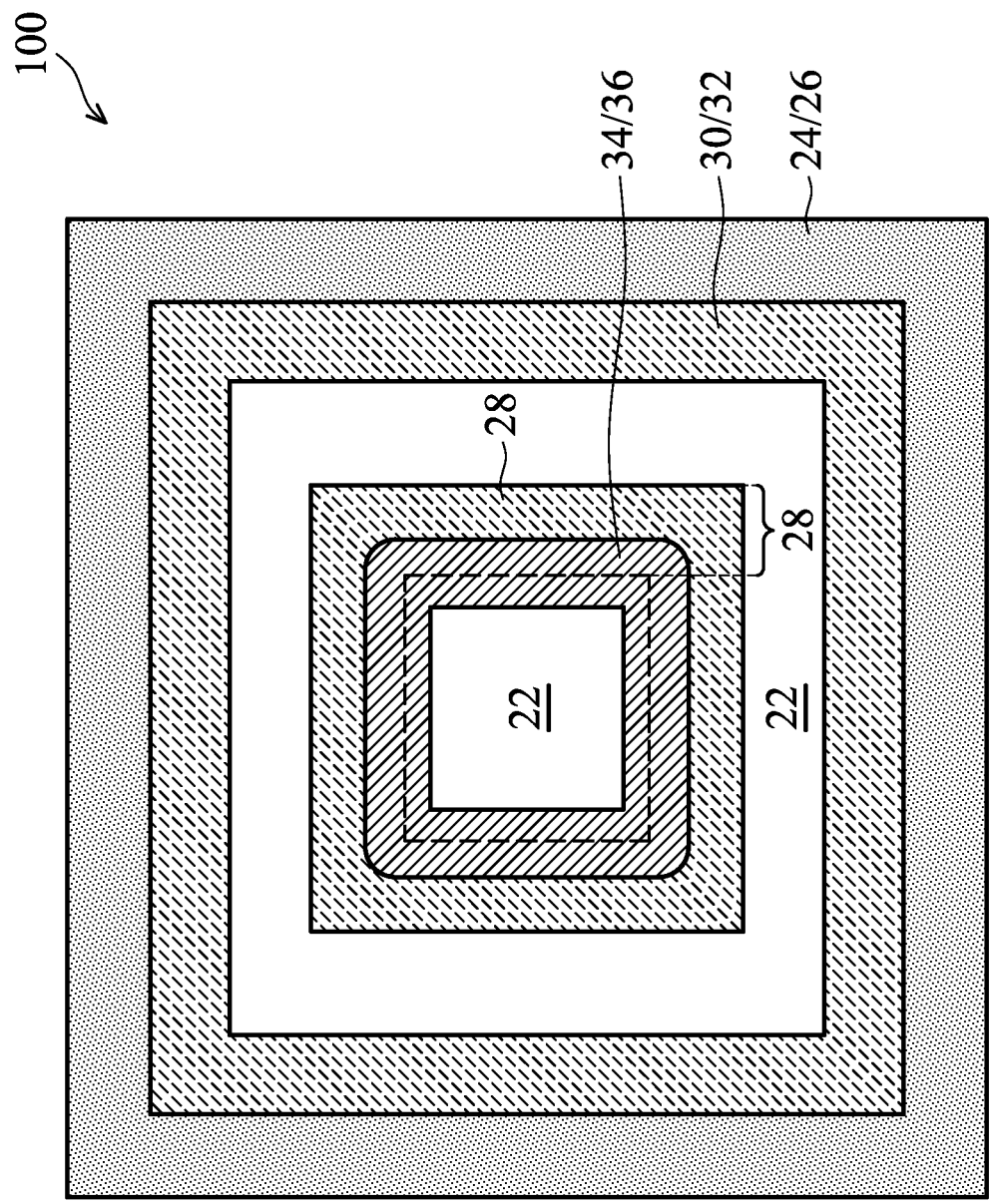

FIGS. 3A and 3B illustrate a cross-sectional view and a top view, respectively of the formation of a gate stack, which includes gate dielectric 34 and gate electrode 36 in accordance with embodiments. Gate dielectric 34 may comprise silicon oxide, silicon nitride, a high-k dielectric material, multi-layers thereof, and/or combinations thereof. Gate electrode 36 may comprise a conductive material such as doped polysilicon, a metal, a metal alloy, and/or the like. Gate dielectric 34 and gate electrode 36 overlap a first portion of p-body 28, and a second portion of p-body 28 is misaligned with gate dielectric 34 and gate electrode 36.

Although each of n-well region 24, deep n-well region 26, p-well region 30, and deep p-well region 32 are illustrated as including separated portions in the cross-sectional view in FIG. 3A, in the top view of the structure in FIG. 3B, each of n-well region 24, deep n-well region 26, p-well region 30, and deep p-well region 32 may form a continuous ring. As shown in FIG. 3B, the rings of n-well region 24 and deep n-well region 26 encircle the rings of p-well region 30 and deep p-well region 32. Furthermore, each of p-body 28, gate dielectric 34, and gate electrode 36 may also form a ring. An outer portion of the gate electrode ring 36 overlaps an inner portion of p-body ring 28. Although not shown, gate spacers are also formed on the sidewalls of gate electrode 36.

Figure 4:
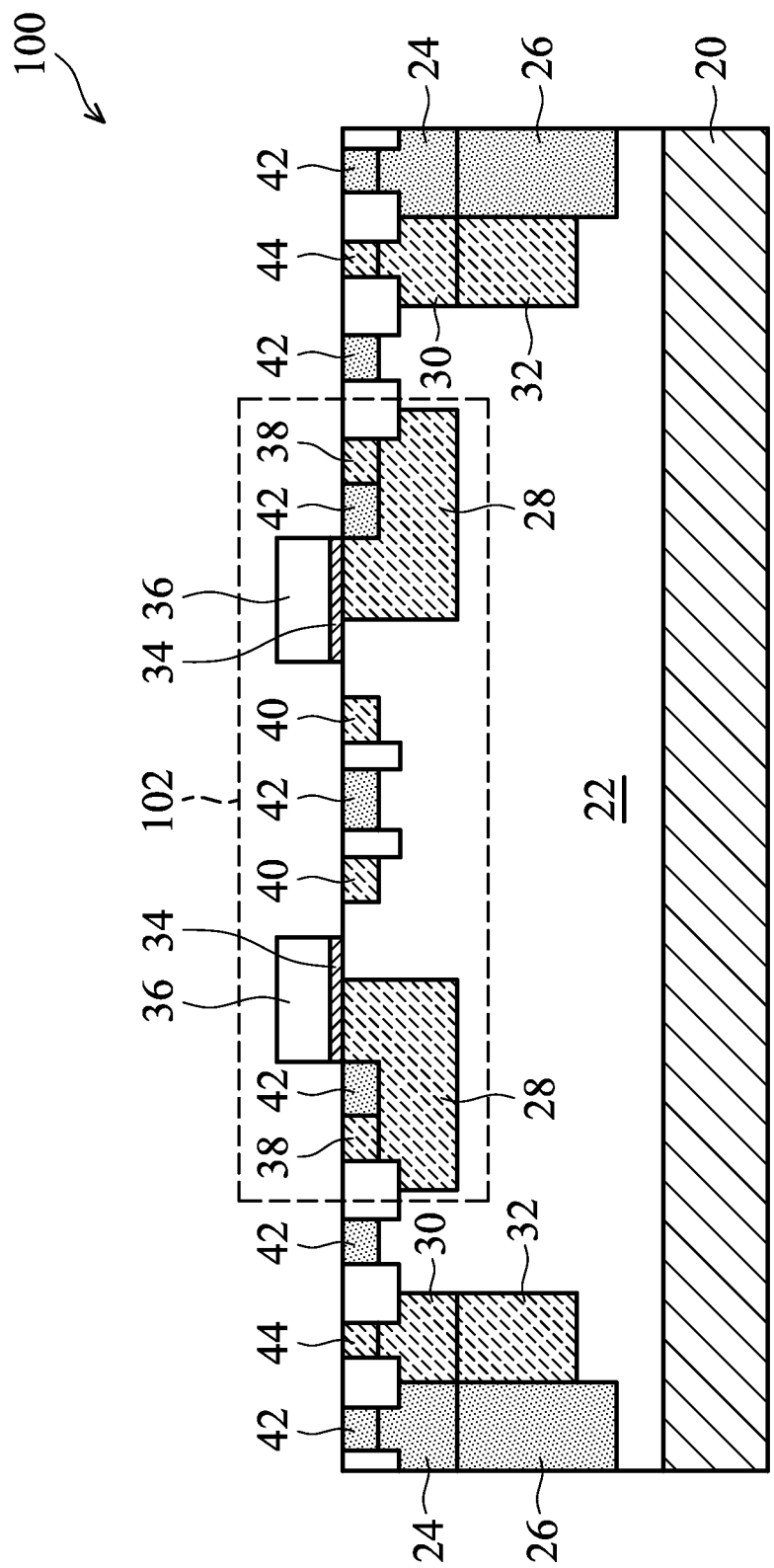

FIG. 4 illustrates the formation of p+ source region 38 and p+ drain region 40. Again, although each of p+ source region 38 and p+ drain region 40 are illustrated as having separated portions, the separated portions may be portions of a continuous p+ source ring 38 and a continuous p+ drain ring 40. P+ source region 38 is also a cathode, and hence is referred to as cathode/source 38 hereinafter. P+ drain region 40 is also an anode, and hence is referred to as anode/drain 40 hereinafter. In addition to cathode/source 38 and anode/drain 40, n+ pickup regions 42 and p+ pickup regions 44 are also formed. The formation of p+ cathode/source 38, p+ anode/drain 40, n+ pickup regions 42, and p+ pickup regions 44 include implantations. The formation of LIGBT 102 is thus finished.

Figure 5:
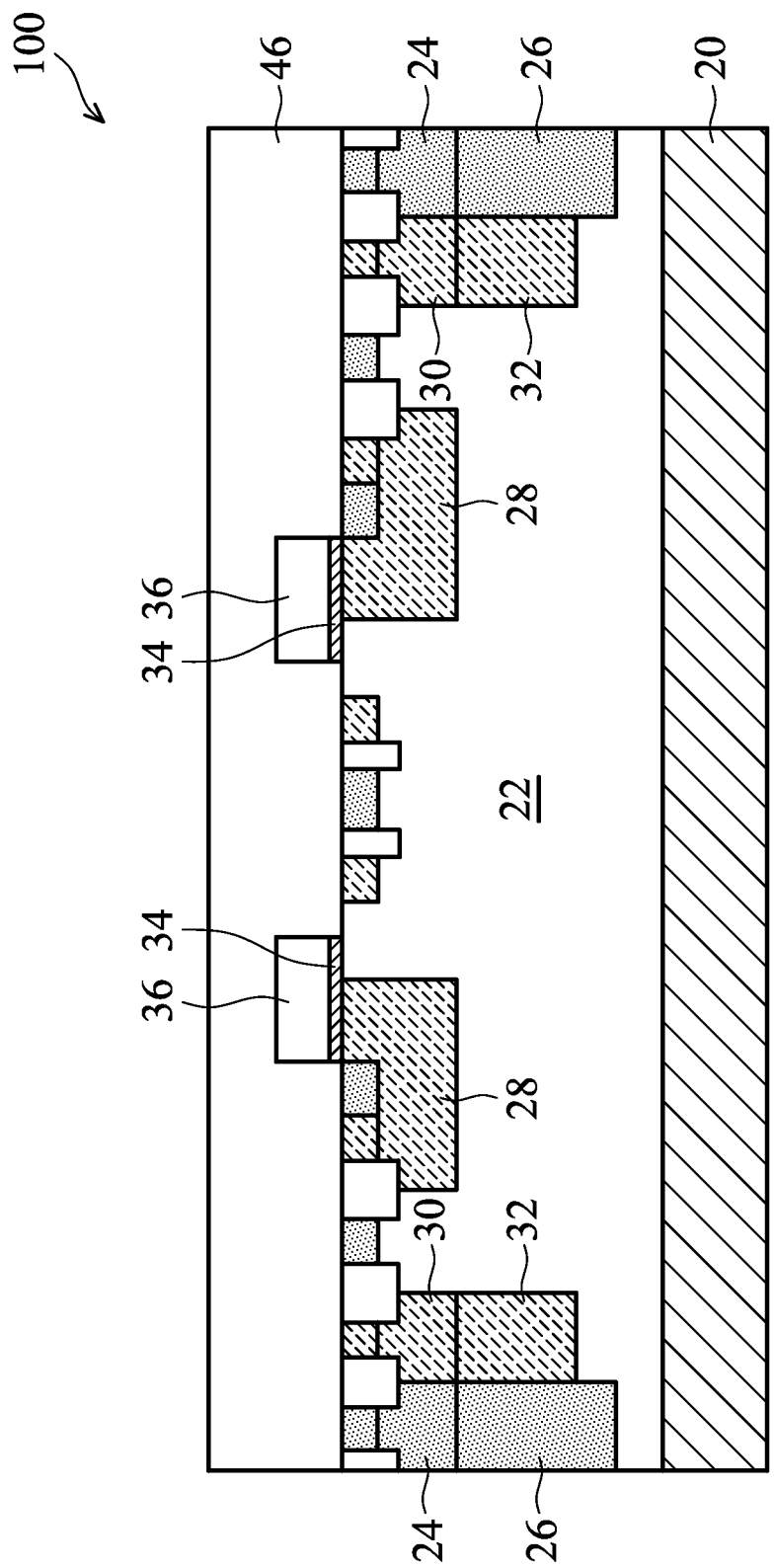

FIG. 5 schematically illustrates the Back End of Line (BEOL) processes for forming BEOL structures 46 overlying gate dielectric 34 and gate electrode 36. The details of BEOL structures 46 are not shown. In some exemplar embodiments, BEOL structure 46 includes an Inter-Layer dielectric (ILD), contact plugs, metal layers, passivation layers, and the like.

Figure 6:
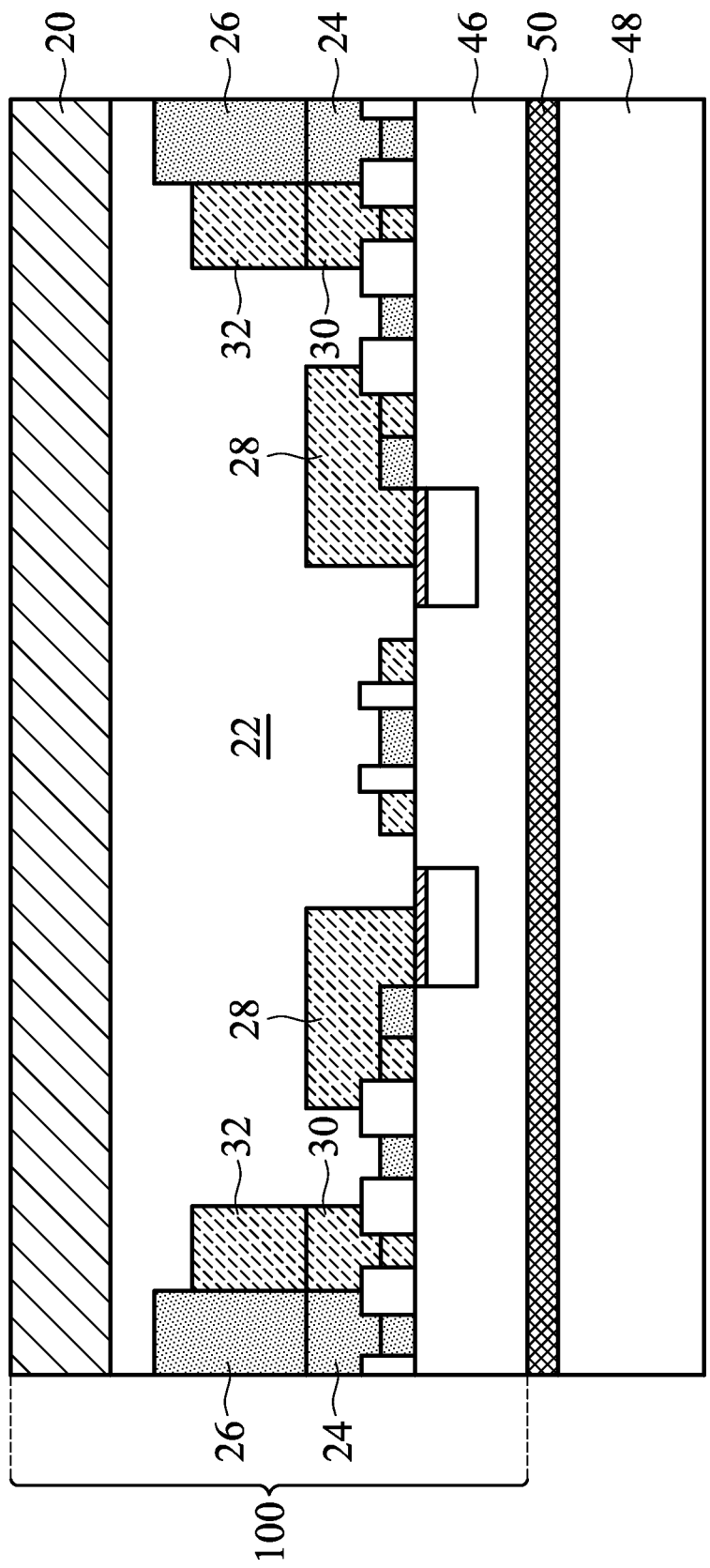
Figure 7:
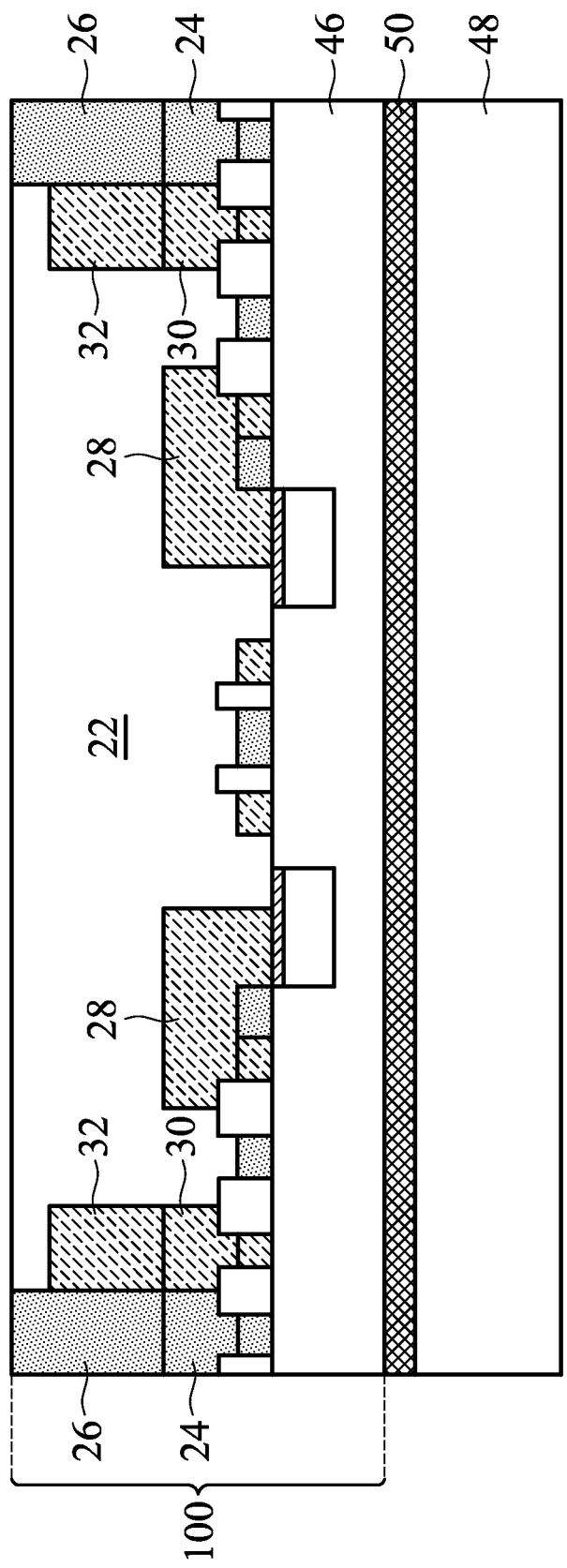

Next, as shown in FIG. 6, wafer 100 is attached to carrier 48, for example, through adhesive 50. BEOL structure 46 is attached to adhesive 50. Carrier 48 may be a glass carrier, a ceramic carrier, or the like. Wafer 100 is then thinned from the backside, and substrate 20 is grinded and removed. The resulting structure is shown in FIG. 7. In some embodiments, the grinding is performed until deep n-well region 26 is exposed. When substrate 20 is a p+ substrate, the difference in the doping concentrations in epitaxy layer 22 and p+ substrate 20 results in a selectivity in the grinding rates. With the selectivity, epitaxy layer 22 may be used as a stop layer for the grinding. After the removal of p+ substrate 20, epitaxy layer 22 is exposed. An over-grinding may be performed to further grind epitaxy layer 22, until deep n-well regions 26 are exposed.

Figure 8:
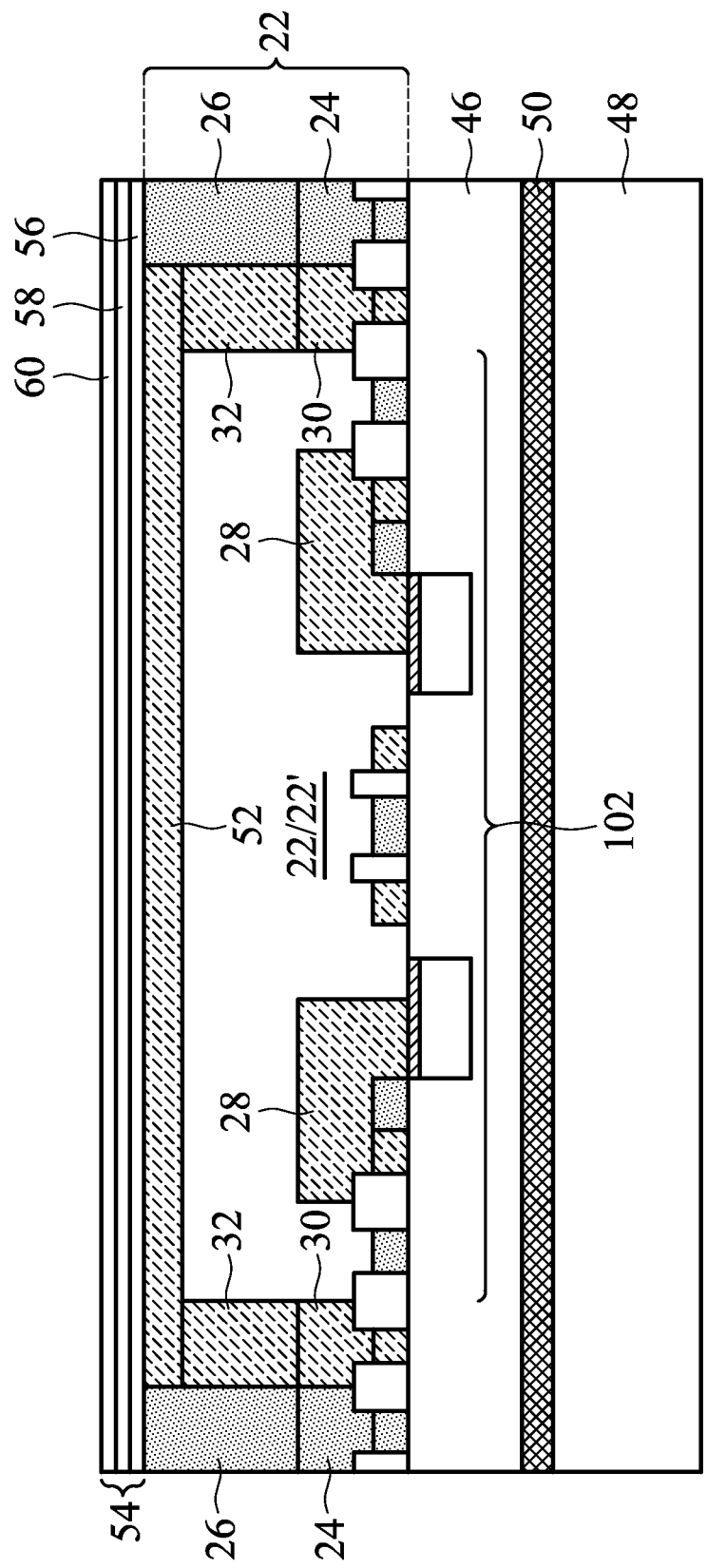
Figure 9:
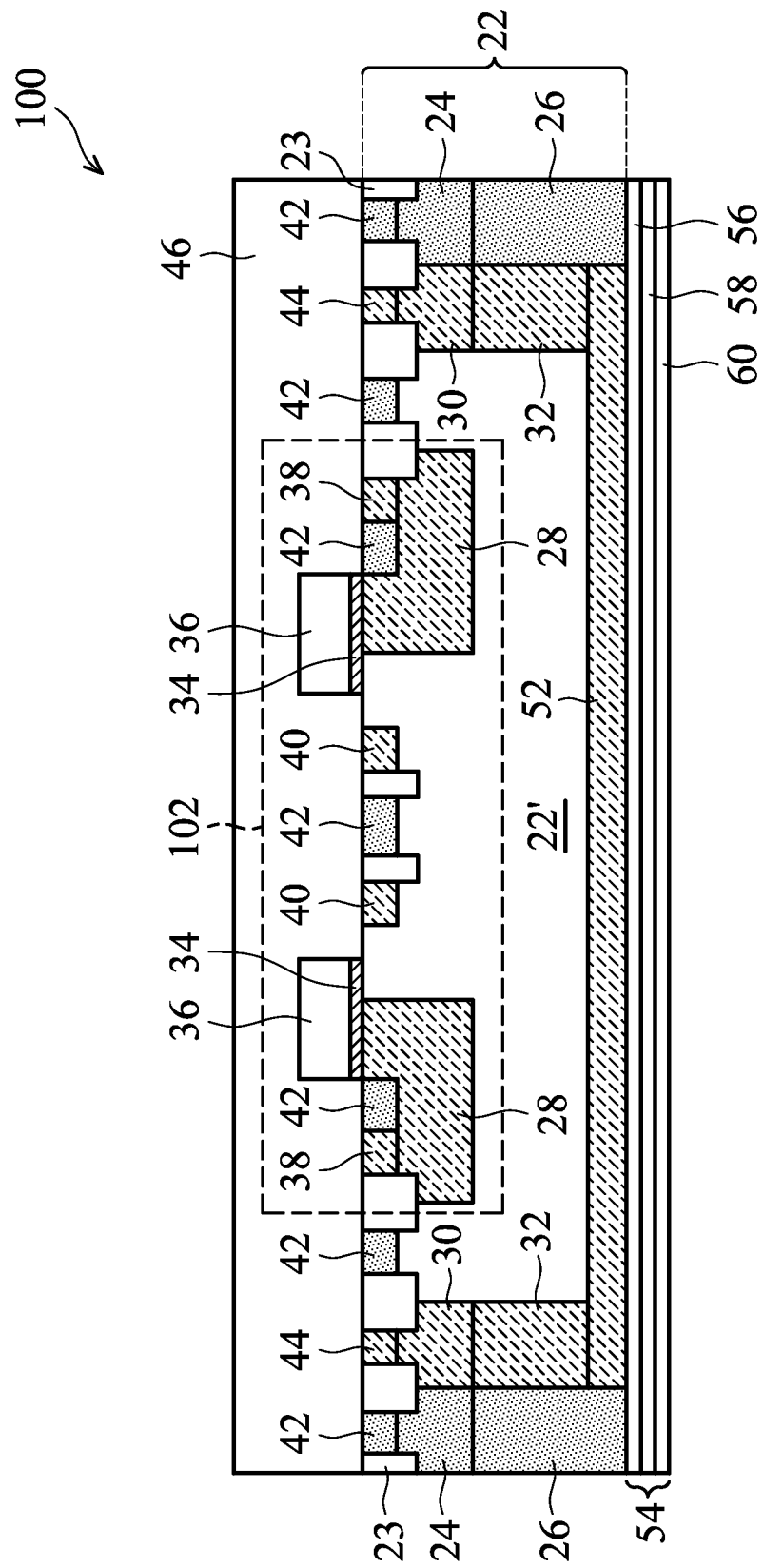

FIG. 8 illustrates the formation of p+ layer 52, which is formed by implanting a p-type impurity into the back surface portion of epitaxy layer 22. P+ layer 52 overlaps, and contacts, the rings that are formed of p-well regions 30 and deep p-well regions 32. P+ layer 52 may have a p-type impurity concentration higher than about $1 \times 10^{19}/cm^3$, higher than about $1 \times 10^{20}/cm^3$, greater than about $1 \times 10^{21}/cm^3$, or higher. P+ layer 52 further overlaps the portion of epitaxy layer 22 that is encircled by the rings formed of p-well region 30 and deep p-well region 32. Accordingly, as shown in FIG. 9, the implanted regions of LIGBT 102 are thus located in the basin formed of p-well region 30 and deep p-well region 32 and p+ layer 52. Throughout the description, the portion of epitaxy layer 22 that is encircled by p-well region 30 and deep p-well region 32 is referred to as an n-type region 22'. An anneal is then performed to anneal p+ layer 52. The anneal may be performed using laser anneal, rapid thermal anneal, or the like.

FIG. 8 further illustrates the formation of dielectric layer 54, which may comprise a single dielectric layer or a plurality of dielectric layers. For example, dielectric layer 54 may include buffer oxide layer 56, bottom Anti-Reflective Coating (BARC) 58, and possibly an additional oxide layer 60. In some exemplary embodiments, buffer oxide layer 56 is formed using a deposition method, which may be Plasma Enhanced Chemical Vapor Deposition (PECVD). BARC 58 may be formed of silicon nitride, silicon oxynitride, and/or the like. Oxide layer 60 may be formed of a Chemical Vapor Deposition (CVD) oxide that is formed using CVD. Additional components (not shown) may be formed over dielectric layer 54 in accordance with exemplary embodiments. The additional components may not include crystalline semiconductor regions therein. In some exemplary embodiments wherein the respective wafer 100 is a Backside Illumination Image sensor (BSI) wafer, additional components (not shown) such as metal grids, color filters, micro-lenses, and the like, may further be formed over dielectric layer 54.

Carrier 48 and adhesive layer 50 are then removed, and the resulting wafer 100 is shown in FIG. 9. Wafer 100 may then be sawed into dies in accordance with some embodiments. As shown in FIG. 9, dielectric layer 54 extends underlying n-well region 24 and deep n-well region 26, which form rings.

Although the preferred embodiments provide a method of forming a p-type LIGBT, one skilled in the art will realize that the teaching of the embodiments is readily available for the formation of n-type LIGBTs, with the conductivity types of the respective implantation regions such as regions 22', 24, 26, 28, 30, 32, 38, 40, 42, 44, and/or 52 inverted.

In the embodiments, p+ layer 52 (FIG. 8), which is used to isolate LIGBT 102, is formed through an implantation step that is performed from the backside of the respective wafer 100. Therefore, since p+ layer 52 is formed as a back surface layer of epitaxy layer 22, the impurity concentration of p+ layer 52 may be very high, and the isolating effect is improved. Furthermore, since n-type region 22' does not contact dielectric materials such as dielectric layer 54, the hole-recombination at the surface of dielectric layer 54 is minimized. The performance of LIGBT 102 is thus improved.

In accordance with embodiments, a device includes a dielectric layer, and a heavily doped semiconductor layer over the dielectric layer. The heavily doped semiconductor layer is of a first conductivity type. A semiconductor region is over the heavily doped semiconductor layer, wherein the semiconductor region is of a second conductivity type opposite the first conductivity type. A Lateral Insulated Gate Bipolar Transistor (LIGBT) is disposed at a surface of the semiconductor region.

In accordance with other embodiments, a device includes a first dielectric layer, a heavily doped semiconductor layer over the first dielectric layer, wherein the heavily doped semiconductor layer is of a first conductivity type, a semiconductor region over the heavily doped semiconductor layer, wherein the semiconductor region is of a second conductivity type opposite the first conductivity type, and a well region forming a ring encircling and level with the semiconductor region, wherein the well region is of the first conductivity type. An LIGBT is disposed at a surface of the semiconductor region. The LIGBT includes a body region of the first conductivity type in the semiconductor region, a gate stack overlapping a portion of the body region, a cathode/source in the body region and of the first conductivity type, and an anode/ drain in the semiconductor region and of the first conductivity type. The cathode/source and the anode/drain are on opposite sides of the gate stack.

In accordance with yet other embodiments, a method includes growing an epitaxy semiconductor layer of a first conductivity type over a semiconductor substrate, and forming an LIGBT at a front surface of the epitaxy semiconductor layer. After the LIGBT is formed, a backside thinning is performed to remove the semiconductor substrate. An implantation is performed from a backside of the epitaxy semiconductor layer to form a heavily doped semiconductor layer. The heavily doped semiconductor layer is of a second conductivity type opposite the first conductivity type.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a dielectric layer;
a heavily doped semiconductor layer over the dielectric layer, wherein the heavily doped semiconductor layer is of a first conductivity type;
a semiconductor region over the heavily doped semiconductor layer, wherein the semiconductor region is of a second conductivity type opposite the first conductivity type; and
a Lateral Insulated Gate Bipolar Transistor (LIGBT) at a surface of the semiconductor region.

2. The device of claim 1, further comprising:
a well region forming a ring encircling the semiconductor region, wherein the heavily doped semiconductor layer is underlying, and contacts, a bottom surface of the well region, and wherein the heavily doped semiconductor layer forms a basin with the well region.

3. The device of claim 1, wherein the LIGBT comprises:
a body region of the first conductivity type in the semiconductor region;
a gate dielectric overlapping a portion of the body region;
a gate electrode overlying the gate dielectric;
a cathode/source in the body region and of the first conductivity type; and
an anode/drain in the semiconductor region and of the first conductivity type, wherein the cathode/source and the anode/drain are on opposite sides of the gate electrode.

4. The device of claim 1, wherein the semiconductor region is in physical contact with the heavily doped semiconductor layer.

5. The device of claim 1, wherein the heavily doped semiconductor layer is in physical contact with the dielectric layer.

6. The device of claim 1, further comprising an additional dielectric layer underlying and in contact with the dielectric layer, wherein the dielectric layer and the additional dielectric layer comprise different dielectric materials.

7. The device of claim 1, wherein the heavily doped semiconductor layer has an impurity concentration higher than about $1 \times 10^{19}/cm^3$.

8. A device comprising:
a first dielectric layer;
a heavily doped semiconductor layer over the first dielectric layer, wherein the heavily doped semiconductor layer is of a first conductivity type;
a semiconductor region over the heavily doped semiconductor layer, wherein the semiconductor region is of a second conductivity type opposite the first conductivity type;
a well region forming a first ring encircling and level with the semiconductor region, wherein the well region is of the first conductivity type; and
a Lateral Insulated Gate Bipolar Transistor (LIGBT) at a surface of the semiconductor region, wherein the LIGBT comprises:
a body region of the first conductivity type in the semiconductor region;
a gate stack overlapping a portion of the body region;
a cathode/source in the body region and of the first conductivity type; and
an anode/drain in the semiconductor region and of the first conductivity type, wherein the cathode/source and the anode/drain are on opposite sides of the gate stack.

9. The device of claim 8, wherein the first conductivity type is p-type, and the second conductivity type is n-type.

10. The device of claim 8, further comprising an additional well region forming a second ring encircling the first ring, wherein the additional well region is of the second conductivity type, and wherein the first dielectric layer extends underlying the second ring.

11. The device of claim 8, wherein the semiconductor region is in physical contact with the heavily doped semiconductor layer.

12. The device of claim 8, wherein the heavily doped semiconductor layer is in physical contact with the first dielectric layer.

13. The device of claim 8 further comprising a second dielectric layer underlying and in contact with the first dielectric layer, wherein the first dielectric layer and the second dielectric layer comprise different dielectric materials.

14. The device of claim 8, wherein the heavily doped semiconductor layer has an impurity concentration higher than about $1 \times 10^{19}/cm^3$.

15. A device comprising:
a dielectric layer;
a heavily doped semiconductor layer over the dielectric layer, wherein the heavily doped semiconductor layer is of a first conductivity type, and wherein the heavily doped semiconductor layer has an impurity concentration higher than about $1 \times 10^{19}/cm^3$;
a semiconductor region over the heavily doped semiconductor layer, wherein the semiconductor region is of a second conductivity type opposite the first conductivity type, and wherein the heavily doped semiconductor layer fully separates the semiconductor region from the dielectric layer; and
a Lateral Insulated Gate Bipolar Transistor (LIGBT) at a surface of the semiconductor region.

16. The device of claim 15 further comprising:

a well region forming a ring encircling the semiconductor region, wherein the well region is of the first conductivity type, wherein the heavily doped semiconductor layer is underlying, and contacts, a bottom surface of the well region, and wherein the heavily doped semiconductor layer forms a basin with the well region.

17. The device of claim 16 further comprising:

a deep well region forming a ring encircling the well region, wherein the deep well region is of the second conductivity type, and wherein a bottom surface of the deep well region is in contact with a top surface of the dielectric layer.

18. The device of claim 15, wherein the LIGBT comprises:

a body region of the first conductivity type in the semiconductor region;

a gate dielectric overlapping a portion of the body region;

a gate electrode overlying the gate dielectric;

a cathode/source in the body region and of the first conductivity type; and an anode/drain in the semiconductor region and of the first conductivity type, wherein the cathode/source and the anode/drain are on opposite sides of the gate electrode.

19. The device of claim 15, wherein the semiconductor region is in physical contact with the heavily doped semiconductor layer.

20. The device of claim 15, wherein the heavily doped semiconductor layer is in physical contact with the dielectric layer.

* * * * *